United States Patent
Ueta et al.

(10) Patent No.: US 9,777,400 B2
(45) Date of Patent: Oct. 3, 2017

(54) METHOD FOR PRODUCING SINGLE CRYSTAL

(71) Applicant: SUMITOMO ELECTRIC INDUSTRIES, LTD., Osaka-shi, Osaka (JP)

(72) Inventors: Shunsaku Ueta, Itami (JP); Tsutomu Hori, Itami (JP); Akira Matsushima, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 96 days.

(21) Appl. No.: 14/808,375

(22) Filed: Jul. 24, 2015

(65) Prior Publication Data

US 2016/0032487 A1   Feb. 4, 2016

(30) Foreign Application Priority Data

Aug. 1, 2014 (JP) ................................. 2014-157587

(51) Int. Cl.
  *C30B 23/06* (2006.01)
  *C30B 29/36* (2006.01)

(52) U.S. Cl.
  CPC ............ *C30B 23/066* (2013.01); *C30B 29/36* (2013.01)

(58) Field of Classification Search
  CPC combination set(s) only.
  See application file for complete search history.

(56) References Cited

U.S. PATENT DOCUMENTS

2007/0256630 A1* 11/2007 Wang ...................... C30B 23/00
                                                                           117/208
2010/0139552 A1*  6/2010 Rengarajan ............. C30B 23/06
                                                                            117/84

FOREIGN PATENT DOCUMENTS

| JP | 05-058774 A | 3/1993 | |
|---|---|---|---|
| JP | H09-48688 A | 2/1997 | |
| JP | 2000-319098 A | 11/2000 | |
| JP | 2006-143497 A | 6/2006 | |
| JP | 2007-230846 A | 9/2007 | |
| JP | 2012-206876 | * 10/2012 | ............ C30B 29/36 |

(Continued)

OTHER PUBLICATIONS

Machine translation of KR10-2004-0106816.*
Machine translation of JP 2012-206876.*

*Primary Examiner* — Duy Deo
*Assistant Examiner* — Erin Bergner
(74) *Attorney, Agent, or Firm* — Drinker Biddle & Reath LLP

(57) ABSTRACT

A method for producing a single crystal includes a step of placing a source material powder and a seed crystal within a crucible, and a step of growing a single crystal on the seed crystal. The crucible includes a peripheral wall part and a bottom part and a lid part that are connected to the peripheral wall part to close the openings of the peripheral wall part, the lid part having a holder that holds the seed crystal. The bottom part has a connection region connected to the peripheral wall part and a thick region that is thicker than the connection region and that surrounds a central axis passing through a center of gravity of orthogonal projection of the bottom part, the orthogonal projection being formed on a plane perpendicular to a growth direction of the single crystal, the central axis extending in the growth direction of the single crystal.

8 Claims, 7 Drawing Sheets

(56) References Cited

FOREIGN PATENT DOCUMENTS

JP      2013-035705 A     2/2013
KR     2004-0106816    * 12/2004   ............. C30B 15/10

* cited by examiner

METHOD FOR PRODUCING SINGLE CRYSTAL

BACKGROUND OF THE INVENTION

1. Field of the Invention

The present disclosure relates to a method for producing a single crystal.

2. Description of the Related Art

A method (sublimation method) of subliming a source material powder and causing recrystallization on a seed crystal within a crucible allows production of a single crystal of silicon carbide, for example. Specifically, the following method is known: a source material powder and a seed crystal are placed within a crucible and the crucible is heated by induction heating to sublime the source material powder to cause recrystallization on the seed crystal. This is described in, for example, Japanese Unexamined Patent Application Publication No. 9-48688 and Japanese Unexamined Patent Application Publication No. 2013-35705.

SUMMARY OF THE INVENTION

A method for producing a single crystal according to the present disclosure includes a step of placing a source material powder and a seed crystal within a crucible and a step of growing a single crystal on the seed crystal. The crucible includes a peripheral wall part being hollow and having openings at both ends, a bottom part connected to the peripheral wall part to close one of the openings of the peripheral wall part, and a lid part connected to the peripheral wall part to close the other one of the openings of the peripheral wall part and having a holder that holds the seed crystal. The bottom part has a connection region connected to the peripheral wall part and a thick region that is thicker than the connection region and that surrounds a central axis passing through a center of gravity of orthogonal projection of the bottom part, the orthogonal projection being formed on a plane perpendicular to a growth direction of the single crystal, the central axis extending in the growth direction of the single crystal. In the step of placing the source material powder and the seed crystal within the crucible, the source material powder is placed so as to be in contact with an inner surface of the bottom part and the seed crystal is placed so as to be held by the holder. In the step of growing the single crystal on the seed crystal, the peripheral wall part is heated to sublime the source material powder to cause recrystallization on the seed crystal.

DESCRIPTION OF THE PREFERRED EMBODIMENTS

Figure 1:
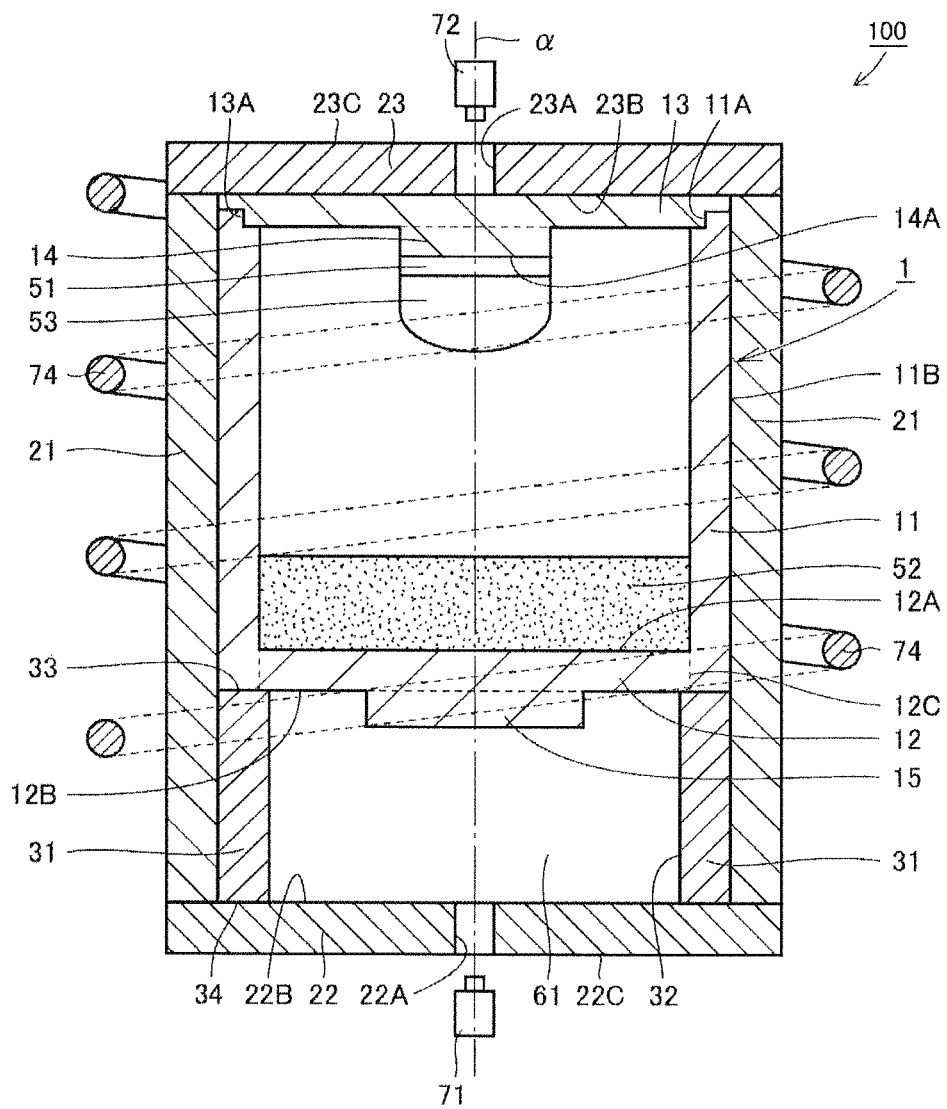
FIG. 1 is a schematic sectional view illustrating the structure of an apparatus for producing a single crystal according to an embodiment.

When a peripheral wall part of a crucible is heated to sublime a source material powder, the content of the crucible has a temperature difference in the radial direction. Specifically, a region closer to the peripheral wall part being heated has a higher temperature while a region farther from the peripheral wall part, that is, a region closer to the central axis has a lower temperature. As a result, is some cases, the source material powder positioned in the region closer to the central axis does not sufficiently sublime, resulting in a low growth rate of the single crystal.

A method for producing a single crystal according to the present disclosure includes a step of placing a source material powder and a seed crystal within a crucible and a step of growing a single crystal on the seed crystal. The crucible includes a peripheral wall part being hollow and having openings at both ends, a bottom part connected to the peripheral wall part to close one of the openings of the peripheral wall part, and a lid part connected to the peripheral wall part to close the other one of the openings of the peripheral wall part and having a holder that holds the seed crystal. The bottom part has a connection region connected to the peripheral wall part and a thick region that is thicker than the connection region and that surrounds a central axis passing through a center of gravity of orthogonal projection of the bottom part, the orthogonal projection being formed on a plane perpendicular to a growth direction of the single crystal, the central axis extending in the growth direction of the single crystal. In the step of placing the source material powder and the seed crystal within the crucible, the source material powder is placed so as to be in contact with an inner surface of the bottom part and the seed crystal is placed so as to be held by the holder. In the step of growing the single crystal on the seed crystal, the peripheral wall part is heated to sublime the source material powder to cause recrystallization on the seed crystal.

In this method for producing a single crystal according to the present disclosure, the bottom part of the crucible has the thick region, which surrounds the central axis and is thicker than the connection region connected to the peripheral wall part. In the thick region, heating of the bottom part is promoted and heat dissipation from the bottom part is reduced. For this reason, a region close to the central axis has a high temperature, compared with a case of not forming the thick region. As a result, sublimation of the source material powder positioned in the region close to the central axis is promoted, which results in an increase in the growth rate of the single crystal. Thus, the method for producing a single crystal according to the present disclosure allows suppression of a decrease in the growth rate of a single crystal.

In the method for producing a single crystal, the thick region may be formed such that an outer surface of the bottom part protrudes along the central axis. In this case, the thick region can be formed without decreasing the volume of the crucible.

In the method for producing a single crystal, in the step of growing the single crystal on the seed crystal, the peripheral wall part may be heated by induction heating. Induction heating is suitable as a method of heating the crucible.

In the method for producing a single crystal, in the bottom part, the thick region may be set to be thicker by 10 mm or more and 40 mm or less than the connection region connected to the peripheral wall part.

In a case where the difference between the thickness of the bottom part in the connection region connected to the peripheral wall part and the thickness of the bottom part in the thick region is set to 10 mm or more, the effect of increasing heating amount and the effect of suppressing heat dissipation can be sufficiently provided. On the other hand, in a case where the difference between the thickness of the bottom part in the connection region connected to the peripheral wall part and the thickness of the bottom part in the thick region is more than 40 mm, the temperature difference between the outer surface of the bottom part and the source material powder increases, so that it may be difficult to determine the temperature of the source material powder on the basis of the temperature of the outer surface of the bottom part. Thus, the difference between the thickness of the bottom part in the connection region connected to the peripheral wall part and the thickness of the bottom part in the thick region may be set to 40 mm or less, so that the temperature of the source material powder is easily determined on the basis of the temperature of the outer surface of the bottom part.

The thick region is preferably formed within a region centered on the central axis and having a diameter that is 30% or less of the inner diameter of the crucible; in particular, the diameter is preferably 20% or less of the inner diameter of the crucible. The thick region is preferably formed, with respect to orthogonal projection of the bottom part on a plane perpendicular to the growth direction of the single crystal, so as to account for 10% or more and 40% or less of the area of the bottom part.

In the method for producing a single crystal, in the step of placing the source material powder and the seed crystal within the crucible, the source material powder and the seed crystal that are formed of silicon carbide may be placed within the crucible; and in the step of growing the single crystal on the seed crystal, the single crystal formed of silicon carbide may be formed on the seed crystal. This method allows efficient production of a silicon carbide single crystal.

In the method for producing a single crystal, the crucible may include, in the thick region, a central region surrounding the central axis and a peripheral region surrounding the central region, and the central region may be thicker than the peripheral region. Thus, within the thick region, the region closer to the central axis is set to be thicker, so that the growth rate of the single crystal can be further increased.

In the method for producing a single crystal, in the step of growing the single crystal on the seed crystal, the crucible may be placed on a spacer so as to form a space starting directly below the outer surface of the bottom part.

In this case where the space is formed so as to start directly below the outer surface of the bottom part, heat dissipation from the bottom part considerably increases. Even in this case, the method for producing a single crystal with the crucible having the thick region allows suppression of a decrease in the growth rate of the single crystal.

In the method for producing a single crystal, the crucible may have an inner diameter of 110 mm or more. In such a case where the crucible has a large inner diameter of 110 mm or more, a temperature difference in the content of the crucible in the radial direction increases beyond the allowable limit, which results in a considerable decrease in the growth rate of the single crystal due to insufficient sublimation of the source material powder near the central axis. Even in this case, the method for producing a single crystal with the crucible having the thick region allows suppression of the decrease in the growth rate of the single crystal.

Embodiment

Hereinafter, an embodiment in which a single crystal of silicon carbide is produced will be described as an example with reference to drawings. In these drawings, the same or corresponding components are denoted by the same reference numerals and repetitive descriptions thereof may be omitted.

Referring to FIG. 1, a single-crystal production apparatus 100 according to this embodiment includes a crucible 1, a spacer 31, heat-insulating members 21, 22, and 23, radiation thermometers 71 and 72, and an induction heating coil 74.

The crucible 1 is formed of a material that can be heated by induction heating, such as graphite. The crucible 1 includes a peripheral wall part 11 being hollow and having openings at both ends; a bottom part 12 connected to the peripheral wall part 11 to close one of the openings of the peripheral wall part 11; and a lid part 13 connected to the peripheral wall part 11 to close the other one of the openings of the peripheral wall part 11 and having a holder 14 that holds a seed crystal 51. In this embodiment, the peripheral wall part 11 has the shape of a hollow cylinder. The inner diameter of the peripheral wall part 11, that is, the inner diameter of the crucible 1, is 110 mm or more, for example. The bottom part 12 has the shape of a disc. The peripheral wall part 11 and the bottom part 12 are integrated. The bottom part 12 has a connection region 12C connected to the peripheral wall part 11 and a thick region 15 that is thicker than the connection region 12C and that surrounds a central axis α passing through the center of gravity of orthogonal projection of the bottom part 12, the orthogonal projection being formed on a plane perpendicular to a growth direction of a single crystal 53, the central axis α extending in the growth direction of the single crystal 53. The thick region 15 is formed such that an outer surface 12B of the bottom part 12 protrudes along the central axis α. More specifically, the thick region 15 is a disc-shaped protrusion region formed as a portion of the outer surface 12B of the bottom part 12. The central axis of the bottom part 12 is coaxial with the central axis of the thick region 15. The central axis of the thick region 15 is coaxial with the central axis α. The thick region 15 is thicker, for example, by 10 mm or more and 40 mm or less than the bottom part 12 in the connection region 12C connected to the peripheral wall part 11.

The lid part 13 is detachably attached to the peripheral wall part 11. The lid-part bonding surface 13A formed in an outer circumferential portion of the lid part 13 is brought into contact with a peripheral-wall-part bonding surface 11A formed in an inner circumferential portion of the peripheral wall part 11, so that the lid part 13 is fixed to the peripheral wall part 11. The lid-part bonding surface 13A and the peripheral-wall-part bonding surface 11A may have spiral screw grooves, for example. The holder 14 is formed on one of the main surfaces of the lid part 13 so as to protrude from a central portion of the main surface. When the lid part 13 is attached to the peripheral wall part 11, the holder 14 is positioned so as to include the central axis α. A holding surface 14A for holding a seed crystal is formed at the end of the holder 14.

The spacer 31 is formed of a molded heat-insulating material, for example. The spacer 31 has the shape of a hollow cylinder. The outer diameter of the spacer 31 is substantially equal to that of the crucible 1. The crucible 1 is placed on the spacer 31 such that the outer surface 12B of the bottom part 12 of the crucible 1 is in contact with a first end surface 33 of the spacer 31. Thus, a space 61 is formed so as to start directly below the outer surface 12B of the bottom part 12 of the crucible 1. In this state where the crucible 1 is placed on the spacer 31, an outer surface 11B of the peripheral wall part 11 of the crucible 1 and the outer circumferential surface of the spacer 31 are positioned so as to surround the same cylindrical plane. The spacer 31 has an inner diameter that is smaller, for example, by 10 mm or more and 60 mm or less than the outer diameter thereof.

The heat-insulating members 21, 22, and 23 are each formed of a molded heat-insulating material, for example. The heat-insulating member 22 has the shape of a disc. The spacer 31 is disposed on the heat-insulating member 22 such that a second end surface 34 of the spacer 31 is in contact with a first main surface 22B of the heat-insulating member 22. The heat-insulating member 21 has the shape of a hollow cylinder. The heat-insulating member 21 is disposed so as to entirely cover the outer circumferential surface of the spacer 31 and the outer surface 11B of the peripheral wall part 11 of the crucible 1. The heat-insulating member 23 is disposed on an outer surface of the lid part 13 so as to cover the outer surface of the lid part 13 of the crucible 1. The spacer 31 and the crucible 1 are surrounded by the heat-insulating members 21, 22, and 23. A through-hole 22A is formed in a region of the heat-insulating member 22, the region including the central axis α. The radiation thermometer 71 is disposed so as to face the bottom part 12 of the crucible 1 through the through-hole 22A. The radiation thermometer 71 measures the temperature of the bottom part 12, which allows determination of the temperature of a source material powder 52. On the other hand, a through-hole 23A is formed in a region of the heat-insulating member 23, the region including the central axis α. The radiation thermometer 72 is disposed so as to face the lid part 13 of the crucible 1 through the through-hole 23A. The radiation thermometer 72 measures the temperature of the lid part 13, which allows determination of the temperature of the seed crystal 51.

The induction heating coil 74 is disposed so as to spirally surround the outer surface 11B of the peripheral wall part 11 of the crucible 1, the outer surface 11B being covered with the heat-insulating member 21. The induction heating coil 74 is connected to a power supply (not shown).

Figure 2:
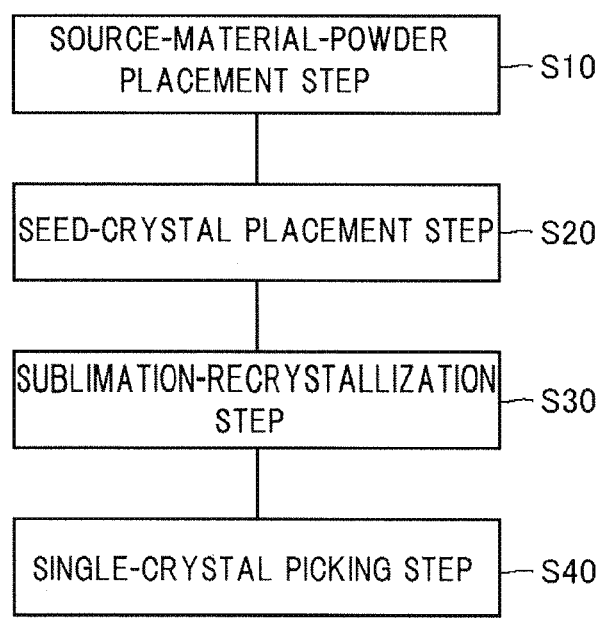
FIG. 2 is a flow chart illustrating the outline of a method for producing a single crystal.

Hereinafter, a method for producing a silicon carbide single crystal with the above-described single-crystal production apparatus 100 will be described. Referring to FIG. 2, in a method for producing a silicon carbide single crystal according to this embodiment, a source-material-powder placement step is firstly carried out as Step S10. In this Step S10, referring to FIG. 1, the source material powder 52 is placed so as to be in contact with an inner surface 12A of the bottom part 12 of the crucible 1. Specifically, while the lid part 13 is detached from the crucible 1, the source material powder 52 is placed into the crucible 1.

Subsequently, a seed-crystal placement step is carried out as Step S20. In this Step S20, the seed crystal 51 is placed on the holder 14. Specifically, for example, the seed crystal 51 is bonded to the holder 14 of the lid part 13 having been detached from the peripheral wall part 11. The seed crystal 51 is bonded to the holding surface 14A of the holder 14. Subsequently, the lid part 13 is attached to the peripheral wall part 11. Thus, the seed crystal 51 is disposed in a region intersecting the central axis α. As a result of Steps S10 and S20, the source material powder 52 and the seed crystal 51 are placed within the crucible 1.

Subsequently, a sublimation-recrystallization step is carried out as Step S30. In this Step S30, the source material powder 52 is sublimed to cause recrystallization on the seed crystal 51 to thereby grow the single crystal 53 on the seed crystal 51. Specifically, this step is carried out in the following manner, for example. While the crucible 1 containing the source material powder 52 and the seed crystal 51 is placed on the spacer 31 in the above-described manner, the crucible 1 and the spacer 31 are covered with the heat-insulating members 21, 22, and 23. The crucible 1 and the spacer 31 covered with the heat-insulating members 21, 22, and 23 are placed in a region surrounded by the induction heating coil 74 as illustrated in FIG. 1. Application of a high-frequency current to the induction heating coil 74 allows the peripheral wall part 11 to be heated by induction heating. As a result, the source material powder 52 that is powder of silicon carbide sublimes, resulting in generation of source material gas, which is gas of silicon carbide. This source material gas is supplied onto the seed crystal 51. As a result, recrystallization from the source material gas occurs on the seed crystal 51, so that the single crystal 53 of silicon carbide is formed on the seed crystal 51. While these growth conditions are maintained, the single crystal 53 grows in the direction along the central axis α. After a predetermined heating time lapses, the heating is stopped. Thus, Step S30 is completed.

Subsequently, a single-crystal picking step is carried out as Step S40. In this Step S40, the single crystal having grown within the crucible 1 by Step S30 is taken out from the crucible 1. Specifically, after the heating in Step S30 is stopped, the crucible 1 is taken out from the region surrounded by the induction heating coil 74. After that, the lid part 13 is detached from the crucible 1. The single crystal 53 is picked up from the lid part 13. Thus, this step completes the method for producing a single crystal according to this embodiment. The picked single crystal is sliced into wafers and used for production of semiconductor devices, for example.

As described above, the method for producing a single crystal according to this embodiment employs the crucible 1 having the thick region 15 in the bottom part 12. In the thick region 15, heating of the bottom part 12 is promoted and heat dissipation from the bottom part 12 is reduced. For this reason, a region close to the central axis α has a high temperature, compared with a case of not forming the thick region 15. As a result, the source material powder 52 positioned in the region close to the central axis α sufficiently sublimes, resulting in a high growth rate of the single crystal 53. Thus, the method for producing a single crystal according to this embodiment allows an increase in the growth rate of the single crystal 53.

First Modification

Hereinafter, a first modification relating to the embodiment will be described. Basically, as in the embodiment, a method for producing a single crystal according to the first modification is carried out to provide advantages. However, the method for producing a single crystal according to the first modification is different from the embodiment in the configuration of the thick region 15 formed in the bottom part 12 of the crucible 1.

Figure 3:
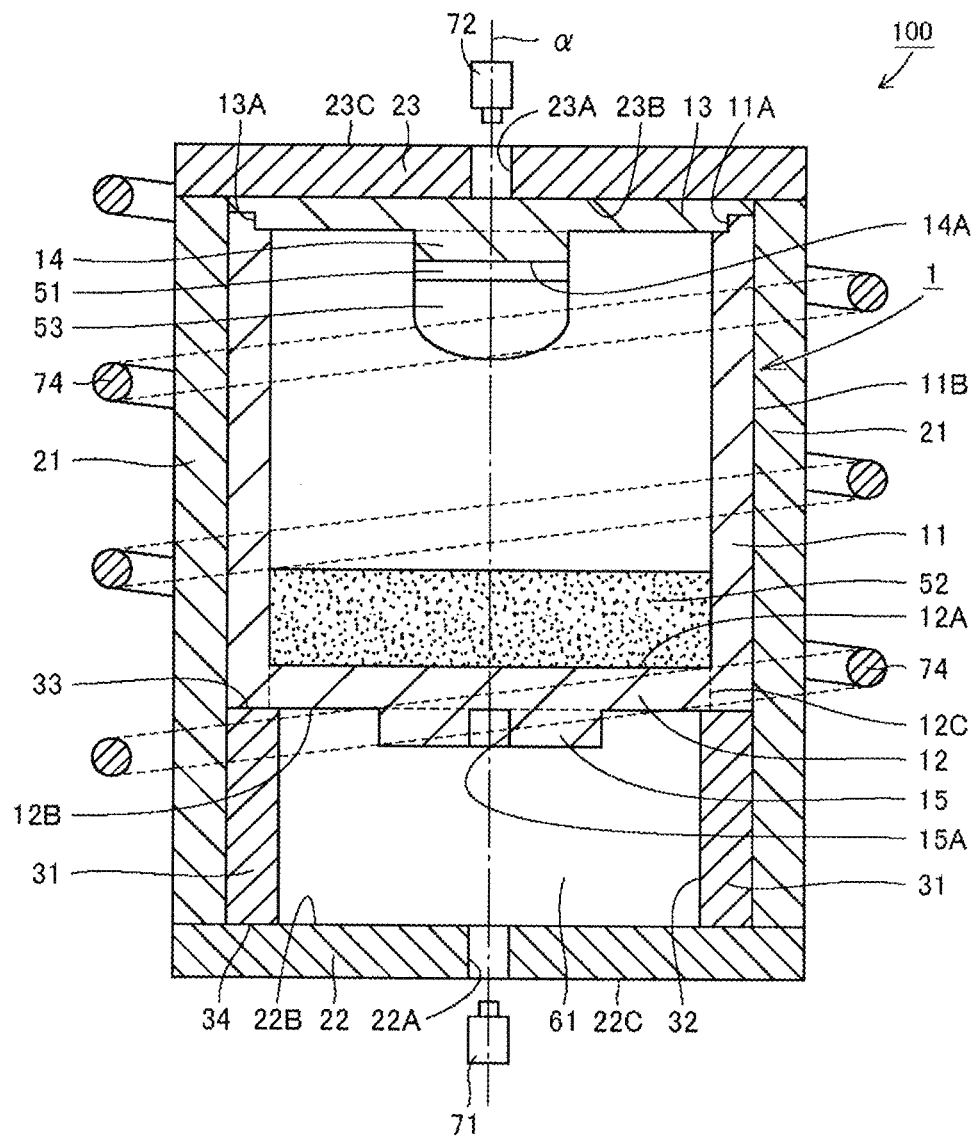
FIG. 3 is a schematic sectional view illustrating the structure of an apparatus for producing a single crystal according to a first modification.

Specifically, referring to FIGS. 3 and 1, the first modification is different from the embodiment in that a recess 15A is formed in a region including the central axis α in the thick region 15 formed in the bottom part 12. The recess 15A is not a through-hole. The recess 15A is thus formed, which allows the radiation thermometer 71 to measure the temperature of a portion of the bottom part 12 close to the source material powder 52. As a result, temperature control during crystal growth is facilitated.

Second Modification

Hereinafter, a second modification relating to the embodiment will be described. Basically, as in the embodiment, a method for producing a single crystal according to the second modification is carried out to provide advantages. However, the method for producing a single crystal according to the second modification is different from the embodiment in the configuration of the thick region 15 formed in the bottom part 12 of the crucible 1.

Figure 4:
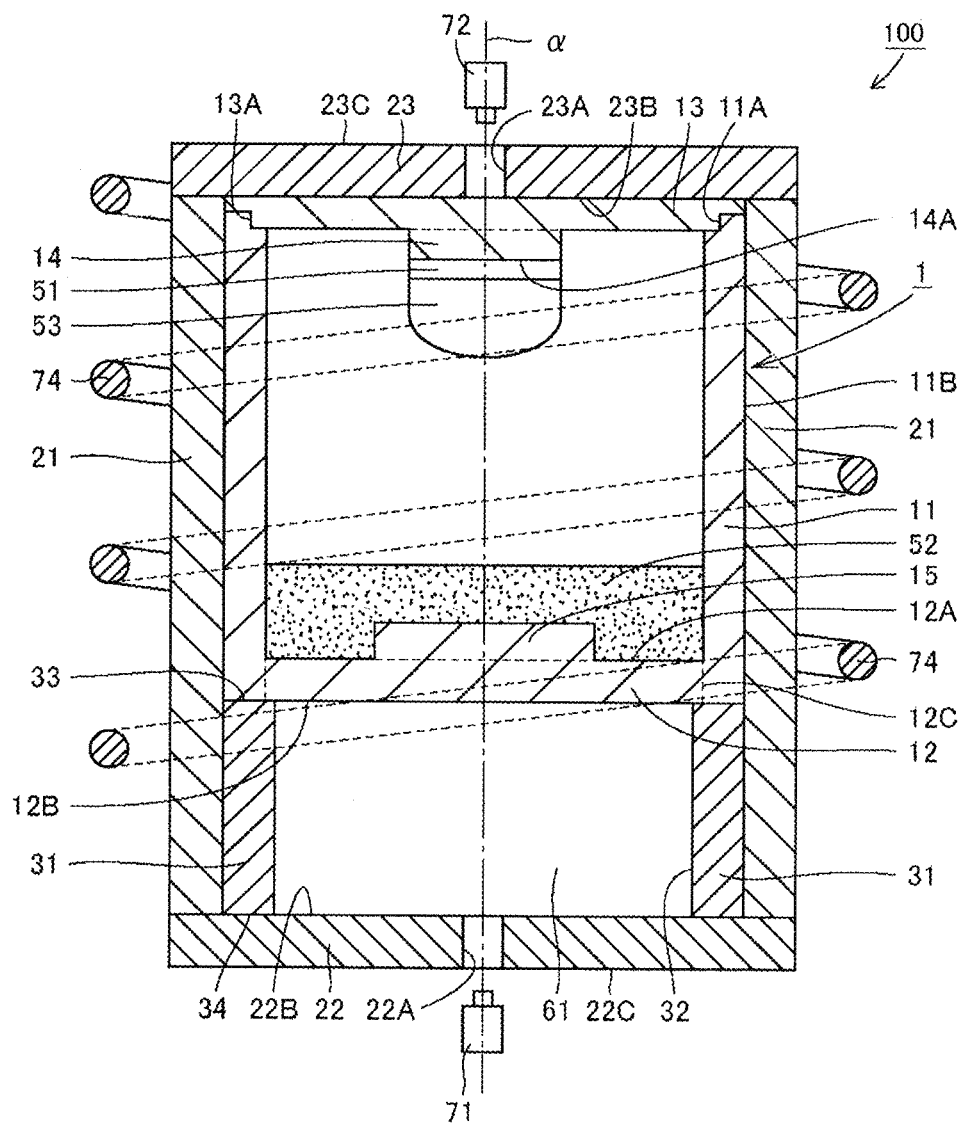
FIG. 4 is a schematic sectional view illustrating the structure of an apparatus for producing a single crystal according to a second modification.

Specifically, referring to FIGS. 4 and 1, the second modification is different from the embodiment in that the thick region 15 is formed such that the inner surface 12A of the bottom part 12 protrudes along the central axis α. Even in this case where the thick region 15 is formed so as to protrude into the crucible 1, advantages as in the embodiment can also be provided.

Third Modification

Hereinafter, a third modification relating to the embodiment will be described. Basically, as in the embodiment, a method for producing a single crystal according to the third modification is carried out to provide advantages. However, the method for producing a single crystal according to the third modification is different from the embodiment in the configuration of the thick region 15 formed in the bottom part 12 of the crucible 1.

Figure 5:
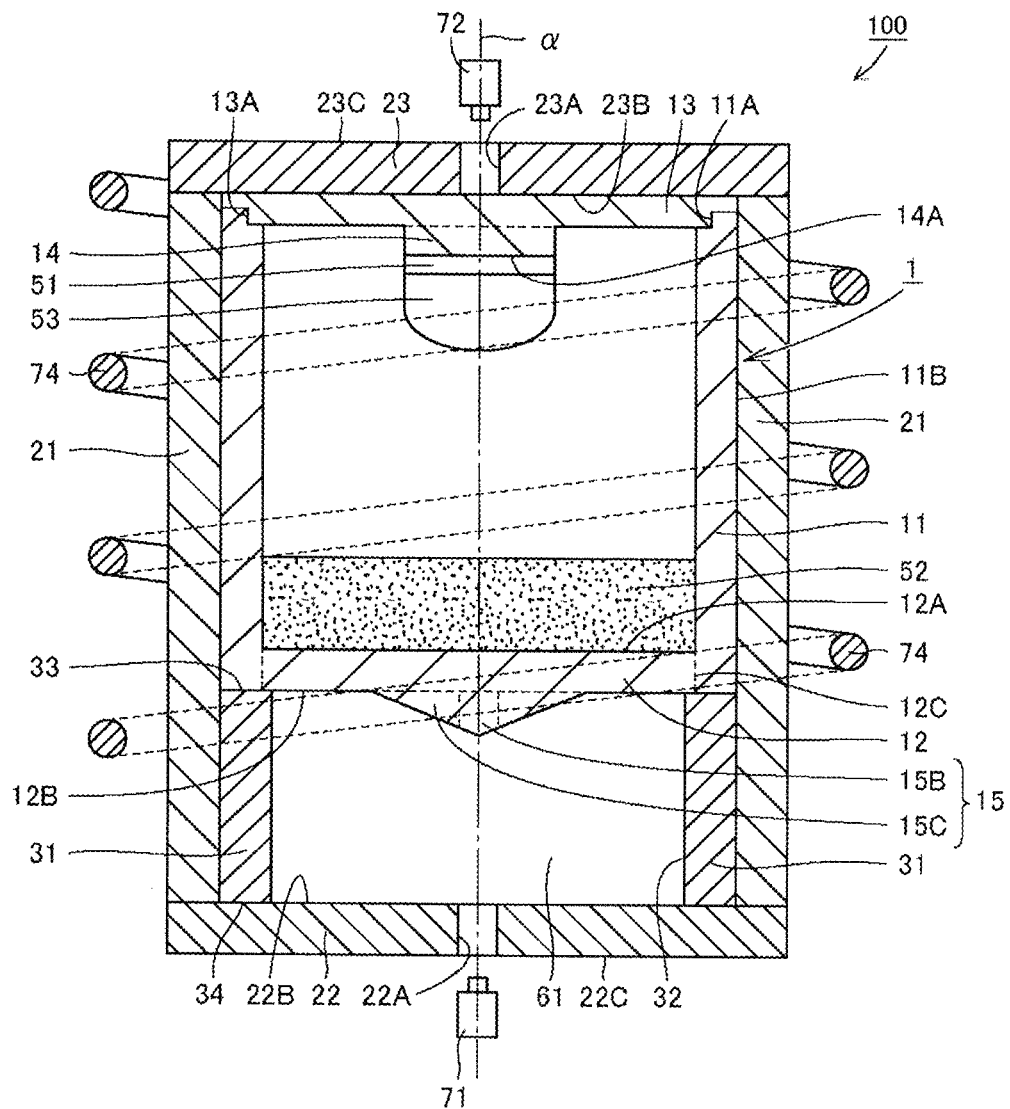
FIG. 5 is a schematic sectional view illustrating the structure of an apparatus for producing a single crystal according to a third modification.

Specifically, referring to FIGS. 5 and 1, the third modification is different from the embodiment in that the thick region 15 has a conical shape. In other words, in the third modification, the closer to the central axis α, the thicker the thick region 15. Stated another way, the thick region 15 has a central region 15B surrounding the central axis α and a peripheral region 15C surrounding the central region 15B; and the central region 15B is thicker than the peripheral region 15C. By employing such a structure, the effect of temperature increase due to formation of the thick region 15 can be further enhanced in a region close to the central axis α in which the temperature tends to decrease.

Fourth Modification

Hereinafter, a fourth modification relating to the embodiment will be described. Basically, as in the embodiment, a method for producing a single crystal according to the fourth modification is carried out to provide advantages. However, the method for producing a single crystal according to the fourth modification is different from the embodiment in the configuration of the thick region 15 formed in the bottom part 12 of the crucible 1.

Figure 6:
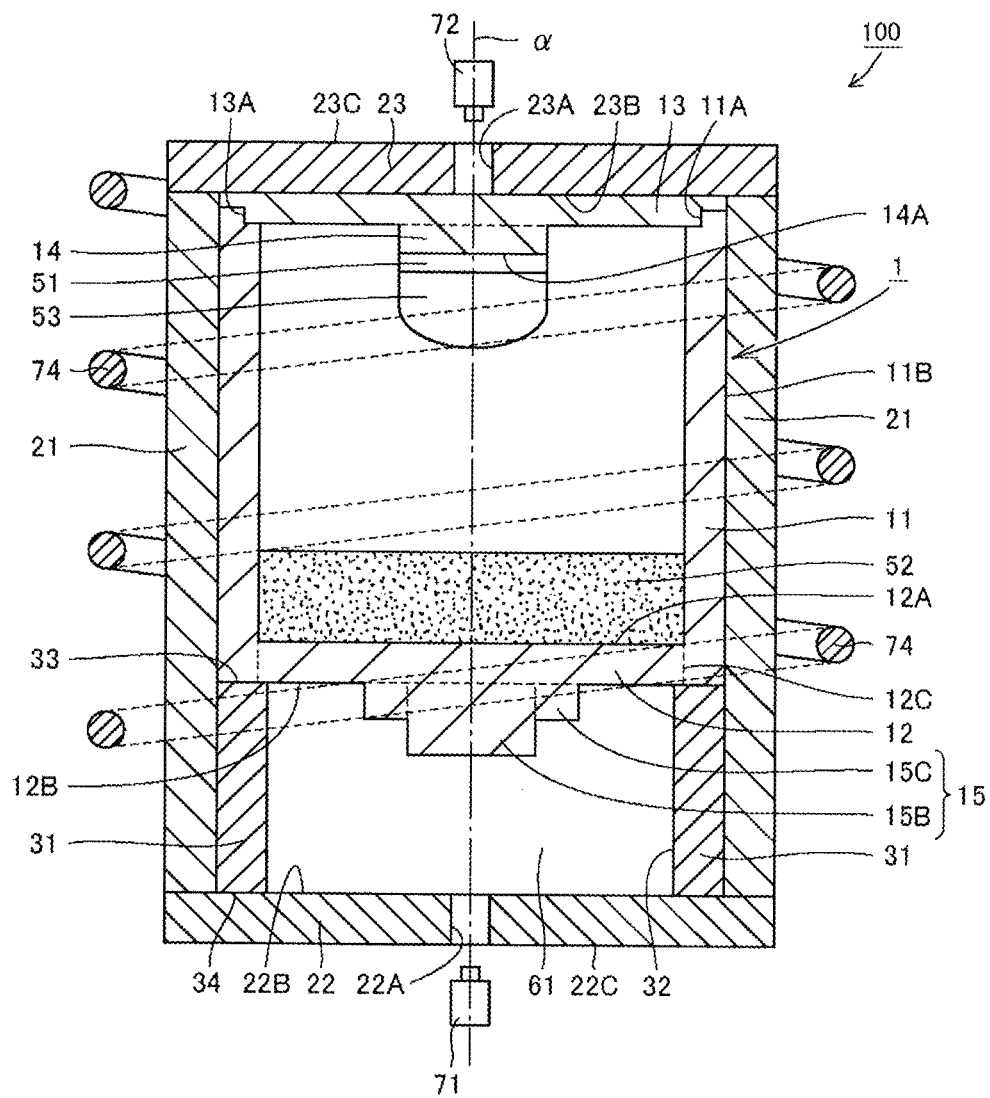
FIG. 6 is a schematic sectional view illustrating the structure of an apparatus for producing a single crystal according to a fourth modification.

Specifically, referring to FIGS. 6 and 1, the fourth modification is different from the embodiment in that the thick region 15 has a stepped shape. In other words, in the fourth modification, the thick region 15 has a structure in which, on a disc-shaped first protrusion region, a disc-shaped second protrusion region having a smaller diameter than the first protrusion region is placed such that the central axes of the regions are coaxial with each other. Stated another way, the thick region 15 has a central region 15B surrounding the central axis α and a peripheral region 15C surrounding the central region 15B; and the central region 15B is thicker than the peripheral region 15C. By employing such a structure, the effect of temperature increase due to formation of the thick region 15 can be further enhanced in a region close to the central axis α in which the temperature tends to decrease.

Fifth Modification

Hereinafter, a fifth modification relating to the embodiment will be described. Basically, as in the embodiment, a method for producing a single crystal according to the fifth modification is carried out to provide advantages. However, the method for producing a single crystal according to the fifth modification is different from the embodiment in the configuration of the bottom part 12 of the crucible 1.

Figure 7:
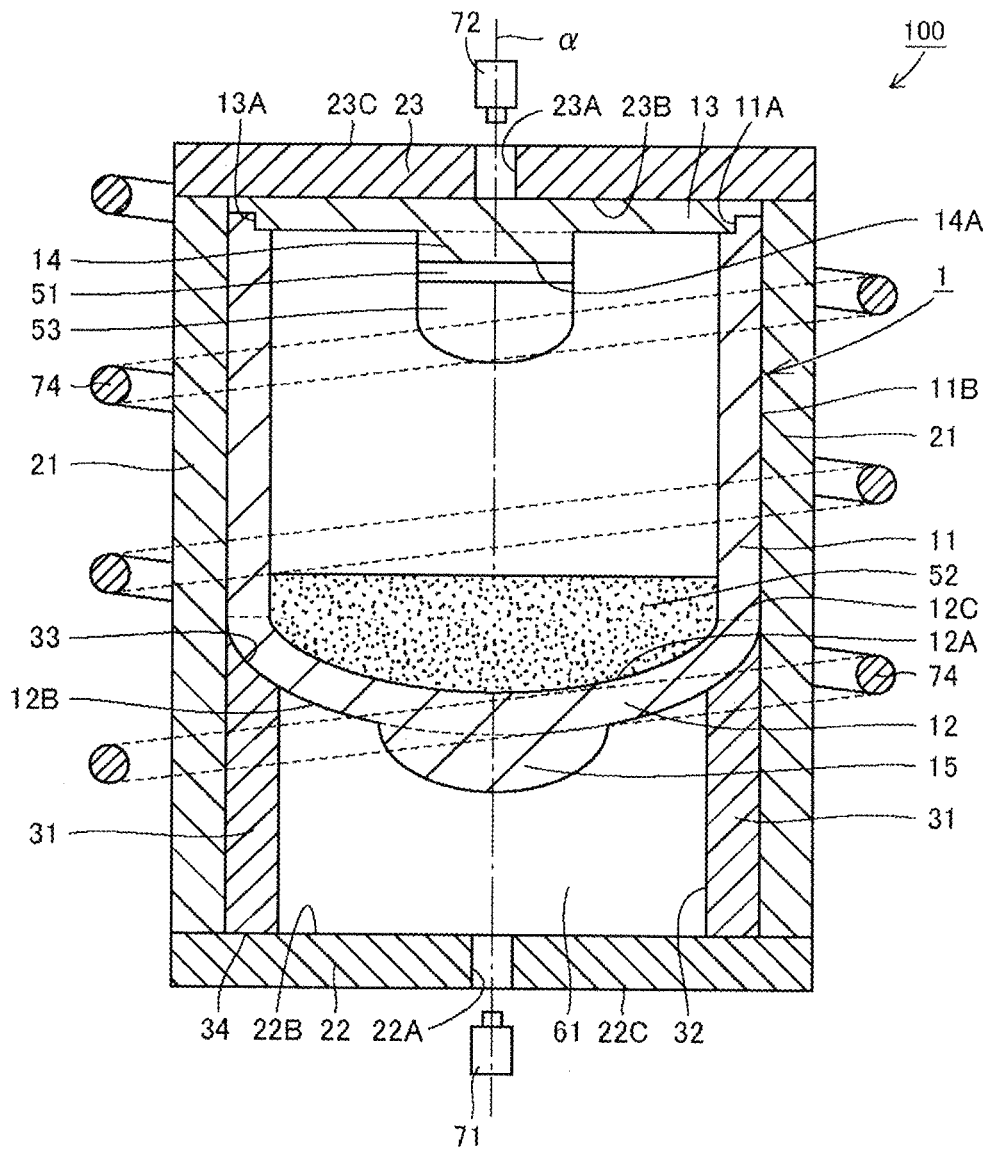
FIG. 7 is a schematic sectional view illustrating the structure of an apparatus for producing a single crystal according to a fifth modification.

Specifically, referring to FIGS. 7 and 1, the fifth modification is different from the embodiment in that the bottom part 12 has the shape of a dome protruding along the central axis α and away from the lid part 13. The thick region 15 is formed such that a dome-shaped portion of the outer surface 12B of the bottom part 12 protrudes along the central axis α. Even in this case where the crucible 1 having such a structure is employed, advantages as in the embodiment can also be provided.

Note that the structures of the crucible 1 in the above-described embodiment and modifications are specific examples of possible structures of the crucible. The possible structures of the crucible are not limited to these examples. For example, some of the structures described in the embodiment and modifications may be appropriately combined and the resultant structure may be employed. In the embodiment and modifications, cases of producing a single crystal formed of silicon carbide are described. However, a method for producing a single crystal according to the present disclosure also allows production of other single crystals that can be produced by a sublimation method, such as a single crystal formed of aluminum nitride. The embodiment relates to a case where the thick region is formed as a portion of the bottom part. Alternatively, for example, the thick region as an independent member may be disposed on the bottom part. In this case, the material of the thick region may be different from that of the crucible. For example, the thick region may be formed of a molded heat-insulating material. In this case, although the effect of promoting heating of the thick region is not provided, heat dissipation from the bottom part is suppressed, which allows suppression of a decrease in the growth rate of the single crystal.

Evaluation

An advantage provided by formation of a thick region in the bottom part of a crucible is evaluated in the following manner.

Sample A

The single-crystal production apparatus 100 having the same structure as in the embodiment is prepared and a single crystal formed of silicon carbide is grown. The crucible 1 has an outer diameter of 140 mm and an inner diameter of 110 mm. The thick region 15 of the bottom part 12 has a thickness of 30 mm. The bottom part 12 except for the thick region 15 has a thickness of 20 mm. As in the embodiment, the seed crystal 51 and the source material powder 52 that are formed of silicon carbide are placed within the crucible 1; current is passed through the induction heating coil 74 to heat the source material powder 52 in the range of 2000° C. to 2400° C.; and this state is maintained for 100 hours to grow the single crystal 53 formed of silicon carbide.

Sample B

A crucible having the same structure as in the embodiment except for the absence of the thick region is prepared. As in the embodiment, the seed crystal and the source material powder are placed within the crucible. The entire surface of the crucible is covered with heat-insulating members and the source material powder is heated to grow a single crystal as in the embodiment.

Sample C

A crucible having the same structure as in the embodiment except for the absence of the thick region is prepared. As in the embodiment, the seed crystal and the source material powder are placed within the crucible. The crucible is placed on a graphite cylindrical member. The crucible and the cylindrical member are covered with heat-insulating members. The source material powder is heated to grow a single crystal as in the embodiment.

Average growth rates of single crystals of Samples A, B, and C (increments in height of single crystals in the direction of the central axis α per hour) are summarized in Table.

TABLE

|  | Average growth rate (mm/h) |
|---|---|
| Sample A | 0.19 |
| Sample B | 0.13 |
| Sample C | 0.11 |

Referring to Table, the average growth rate of Sample A is significantly high, compared with Sample B and Sample C. This is achieved probably for the following reasons. In Sample A, the thick region 15 is formed in the bottom part 12 of the crucible 1. As a result, in the thick region 15, heating of the bottom part 12 is promoted and heat dissipation from the bottom part 12 is reduced, so that the source material powder 52 positioned in a region close to the central axis α sufficiently sublimes.

Embodiments according to the present disclosure are mere examples in all respects and should be understood as non-limitative. The scope of the present invention is indicated by Claims. The scope of the present invention is intended to embrace all the modifications within the meaning and range of equivalency of the Claims.

What is claimed is:

1. A method for producing a single crystal, comprising:
    a step of placing a source material powder and a seed crystal within a crucible; and
    a step of growing a single crystal on the seed crystal,
    wherein the crucible includes:
        a peripheral wall part being hollow and having openings at both ends,
        a bottom part connected to the peripheral wall part to close one of the openings of the peripheral wall part, and
        a lid part connected to the peripheral wall part to close the other one of the openings of the peripheral wall part and having a holder that holds the seed crystal,
    wherein the bottom part has a connection region connected to the peripheral wall part and a thick region that is thicker than the connection region and that surrounds a central axis passing through a center of gravity of orthogonal projection of the bottom part, the orthogonal projection being formed on a plane perpendicular to a growth direction of the single crystal, the central axis extending in the growth direction of the single crystal,
    wherein the bottom part includes a flat inner surface and an outer surface, the thick region being on the outer surface of the bottom part;
    wherein the thick region includes a first disc-shaped protrusion region and a second disc-shaped protrusion region, central axes of the first disc-shaped protrusion region and the second disc-shaped protrusion region being coaxial, and the second disc-shape protrusion region being disposed on the first disc-shaped protrusion region and having a smaller diameter than the first disc-shaped protrusion region,
    wherein, in the step of placing the source material powder and the seed crystal within the crucible, the source material powder is placed so as to be in contact with an inner surface of the bottom part and the seed crystal is placed so as to be held by the holder, and
    wherein, in the step of growing the single crystal on the seed crystal, the peripheral wall part is heated to sublime the source material powder to cause recrystallization on the seed crystal.

2. The method for producing a single crystal according to claim 1,
    wherein the thick region is formed such that the outer surface of the bottom part protrudes along the central axis.

3. The method for producing a single crystal according to claim 1,
    wherein, in the step of growing the single crystal on the seed crystal, the peripheral wall part is heated by induction heating.

4. The method for producing a single crystal according to claim 1,
    wherein, in the bottom part, the thick region is thicker by 10 mm or more and 40 mm or less than the connection region connected to the peripheral wall part.

5. The method for producing a single crystal according to claim 1,
    wherein the source material powder is formed of silicon carbide, the seed crystal is formed of silicon carbide, and
    the single crystal is formed of silicon carbide.

6. The method for producing a single crystal according to claim 1,
    wherein the crucible includes, in the thick region, a central region surrounding the central axis and a peripheral region surrounding the central region, and
    the central region is thicker than the peripheral region.

7. The method for producing a single crystal according to claim 1,
    wherein, in the step of growing the single crystal on the seed crystal, the crucible is placed on a spacer so as to form a space starting directly below the outer surface of the bottom part.

8. The method for producing a single crystal according to claim 1,
    wherein the crucible has an inner diameter of 110 mm or more.

* * * * *